United States Patent [19]

Uemura et al.

[11] Patent Number: 5,321,287

[45] Date of Patent: *Jun. 14, 1994

[54] SEMICONDUCTOR DEVICE WHEREIN N-CHANNEL MOSFET, P-CHANNEL MOSFET AND NONVOLATILE MEMORY CELL ARE FORMED IN ONE CHIP

[75] Inventors: Teruo Uemura, Kawasaki; Naoki Hanada, Yokohama, both of Japan

[73] Assignee: Kabushiki Kaisha Toshiba, Kawasaki, Japan

[*] Notice: The portion of the term of this patent subsequent to Jun. 29, 2010 has been disclaimed.

[21] Appl. No.: 43,533

[22] Filed: Apr. 6, 1993

Related U.S. Application Data

[63] Continuation of Ser. No. 979,426, Nov. 19, 1992, Pat. No. 5,223,451, which is a continuation of Ser. No. 798,999, Dec. 2, 1991, abandoned, which is a continuation of Ser. No. 592,379, Oct. 3, 1990, abandoned.

[30] Foreign Application Priority Data

Oct. 6, 1989 [JP] Japan ................... 1-261569

[51] Int. Cl.[5] ............................. H01L 27/02
[52] U.S. Cl. .................... 257/316; 257/326; 257/371; 257/377
[58] Field of Search ............... 257/316, 371, 377, 326

[56] References Cited

U.S. PATENT DOCUMENTS 4,893,164 1/1990 Shirato .
5,223,451 6/1993 Uemura et al. ............ 257/316

FOREIGN PATENT DOCUMENTS

WO-A8705443 9/1987 PCT Int'l Appl. .

OTHER PUBLICATIONS

Electrical Design News, vol. 30, No. 25, pp. 145-152, 154, D. Cormier: "Erasable/Programmable Solid-State Memories" (Nov., 1985).
Electronics, vol. 61, No. 10, pp. 70-71, "TI's Erasable PLDs Are Fast But Don't Need Much Power" (May 12, 1988).
Electronic Design, vol. 31, No. 20, pp. 44, 46, "FLSI Process Advances Herald The Coming Of Superfast Computers" (Sep., 1983).

*Primary Examiner*—Edward Wojciechowicz
*Attorney, Agent, or Firm*—Finnegan, Henderson, Farabow, Garrett & Dunner

[57] ABSTRACT

An n-channel MOSFET, a p-channel MOSFET and a nonvolatile memory cell are provided for the same semiconductor substrate. The nonvolatile memory cell is formed on the semiconductor substrate, the n-channel MOSFET is formed in a p-type well region of the semiconductor substrate, and the p-channel MOSFET is formed in an n-type well region of the semiconductor substrate.

5 Claims, 6 Drawing Sheets

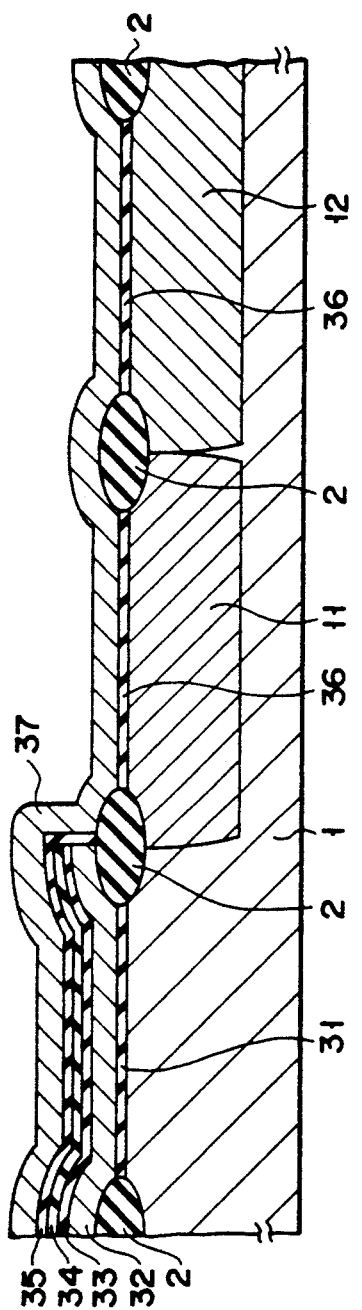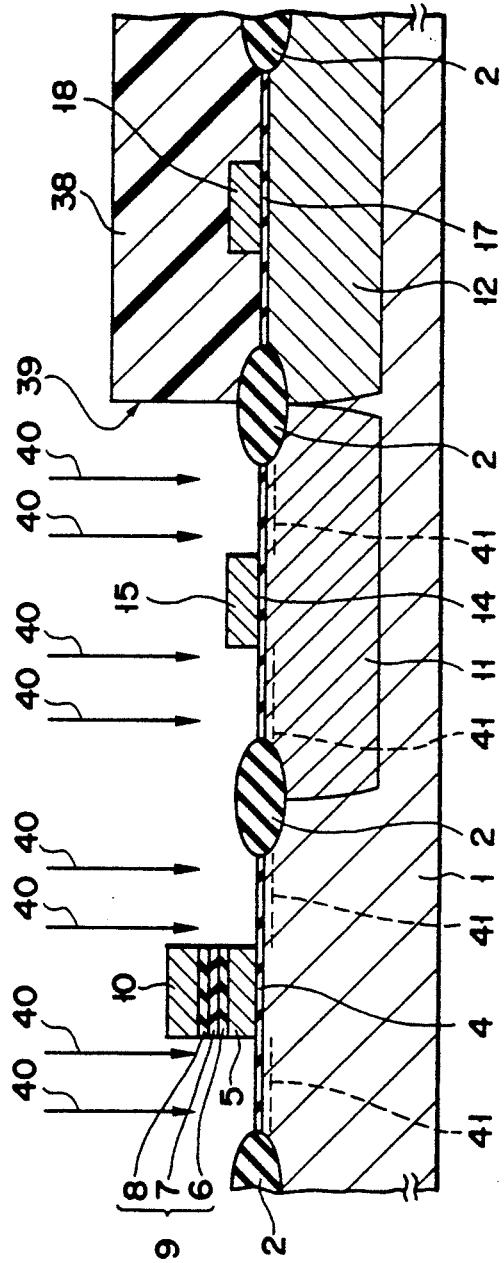

SEMICONDUCTOR DEVICE WHEREIN N-CHANNEL MOSFET, P-CHANNEL MOSFET AND NONVOLATILE MEMORY CELL ARE FORMED IN ONE CHIP

This is a continuation of application Ser. No. 07/979,426, filed on Nov. 19, 1992, now U.S. Pat. No. 5,223,451, which is a continuation of application Ser. No. 07/798,999, filed on Dec. 2, 1991, now abandoned, which is a continuation of application Ser. No. 07/592,379, filed on Oct. 3, 1990, now abandoned.

BACKGROUND OF THE INVENTION

1. Field of the Invention

The present invention relates to a semiconductor device wherein an n-channel MOSFET, a p-channel MOSFET and a nonvolatile memory cell are formed in one chip.

2. Description of the Related Art

An EPROM, which is an example of a nonvolatile semiconductor memory device, is made up mainly of a group of EPROM memory cells, and a peripheral circuit such as a decoder used for selecting the memory cells. In general, the peripheral circuit is constituted by a MOSFET. Presently-available MOSFETs include an n-channel MOSFET and a p-channel MOSFET, and an EPROM whose peripheral circuit is formed by using these two types of MOSFETs is generally referred to as a CMOS-type EPROM.

In the CMOS-type EPROM, an n-channel MOSFET and an n-channel EPROM memory cell are formed in the major surface of a p-type silicon substrate, and a p-channel type MOSFET is formed on the surface of an n-type well region provided in the p-type silicon substrate.

In the n-channel EPROM memory cell, hot electrons are generated in the channel region of the memory cell transistor, and data writing is carried out, with the hot electrons being captured in a floating gate. The hot electrons have to be implanted into each of a number of floating gates with no deviation. In other words, it is required that the electron concentrations in the floating gates be uniform. To meet with this requirement, the EPROM memory cells are formed on the substrate surface where the impurity concentrations are uniform and stable, and the entire memory cell region is applied with a uniform electric field. It should be noted that the impurity concentration in the substrate is determined in accordance with the characteristics of the EPROM memory cell.

In the circuit section formed by an n-channel MOSFET and a p-channel MOSFET, so-called latch-up becomes a problem. The latch-up is a phenomenon observed in the case where the n-channel MOSFET and the p-channel MOSFET are formed on the same substrate. In this case, a parasitic thyristor within the substrate may be turned on, resulting in a continuous current flow between the two MOSFETs. If the latch-up occurs, the circuit may become out of order; in some cases, it may be broken. If the n-channel MOSFET and the p-channel MOSFET are miniaturized, the latch-up becomes very likely to occur.

In the COMS-type EPROM, the impurity concentration in the substrate is increased, so as to prevent the latch-up between the n-channel MOSFET and the p-channel MOSFET.

In the above method for preventing latch-up, however, it is difficult to increase the impurity concentration in the substrate to an optimal degree, and the impurity concentration in the substrate is liable to become high. If the impurity concentration is too high, the EPROM memory cell may have different characteristics, for example, different writing speeds. If the two types of elements are further miniaturized, the latch-up becomes more likely to occur, so that the reliability of the device is degraded very much.

SUMMARY OF THE INVENTION

Accordingly, an object the present invention is to provide a semiconductor device which allows miniaturization of both an n-channel MOSFET and a p-channel MOSFET, without degrading the reliability of a nonvolatile memory cell, such as an EPROM.

This object is achieved by providing a semiconductor device which comprises: a semiconductor substrate which has a major surface and is of a first conductivity type; first and second semiconductor regions which are formed in the major surface of the substrate while being isolated from each other and which are of a second conductivity type; carrier accumulation means for accumulating carriers, said carrier accumulation means being formed above that surface portion of the substrate which is located between the first and second semiconductor regions; first insulation means, located between the carrier accumulation means and the substrate, for electrically insulating the carrier accumulation means and the substrate from each other; a first conductive layer formed above the carrier accumulation means; second insulation means, located between the first conductive layer and the carrier accumulation means, for electrically insulating the first conductive layer and the carrier accumulation means from each other; a first well region which is formed in the major surface of the substrate and is of the first conductivity type; third and fourth semiconductor regions which are formed in a surface region of the first well region while being isolated from each other and which are of the second conductivity type; a second conductive layer formed above that surface portion of the first well region which is located between the third and fourth semiconductor regions; third insulation means, located between the second conductive layer and the first well region, for electrically insulating the second conductive layer and the first well region from each other; a second well region which is formed in the major surface of the substrate and is of the second conductivity type; fifth and sixth semiconductor regions which are formed in a surface region of the second well region while being isolated from each other and which are of the first conductivity type; a third conductive layer formed above that surface portion of the second well region which is located between the fifth and sixth semiconductor regions; and fourth insulation means, located between the third conductive layer and the second well region, for electrically insulating the third conductive layer and the second well region from each other.

In the above semiconductor device, the carrier accumulation means is located above the major surface of the semiconductor substrate of the first conductivity type. Therefore, a nonvolatile memory cell is reliable in operation, particularly in data writing. In addition, the first well region of the first conductivity type and the second well region of the second conductivity type are formed in the major surface of the semiconductor substrate, and MOSFETs are formed in the first and second well regions, respectively. With this structure, latch-up is prevented from occurring between the MOSFETs, without degrading the reliability of the nonvolatile memory cell. For example, the reliability of data writing and high breakdown voltage are in no way adversely affected by the prevention of latch-up.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 2A-2J are sectional views illustrating how the EPROM shown in FIG. 1 is manufactured.

DETAILED DESCRIPTION OF THE PREFERRED EMBODIMENTS

A nonvolatile semiconductor memory device according to one embodiment of the present invention will now be described, with reference to the accompanying drawings.

Figure 1:
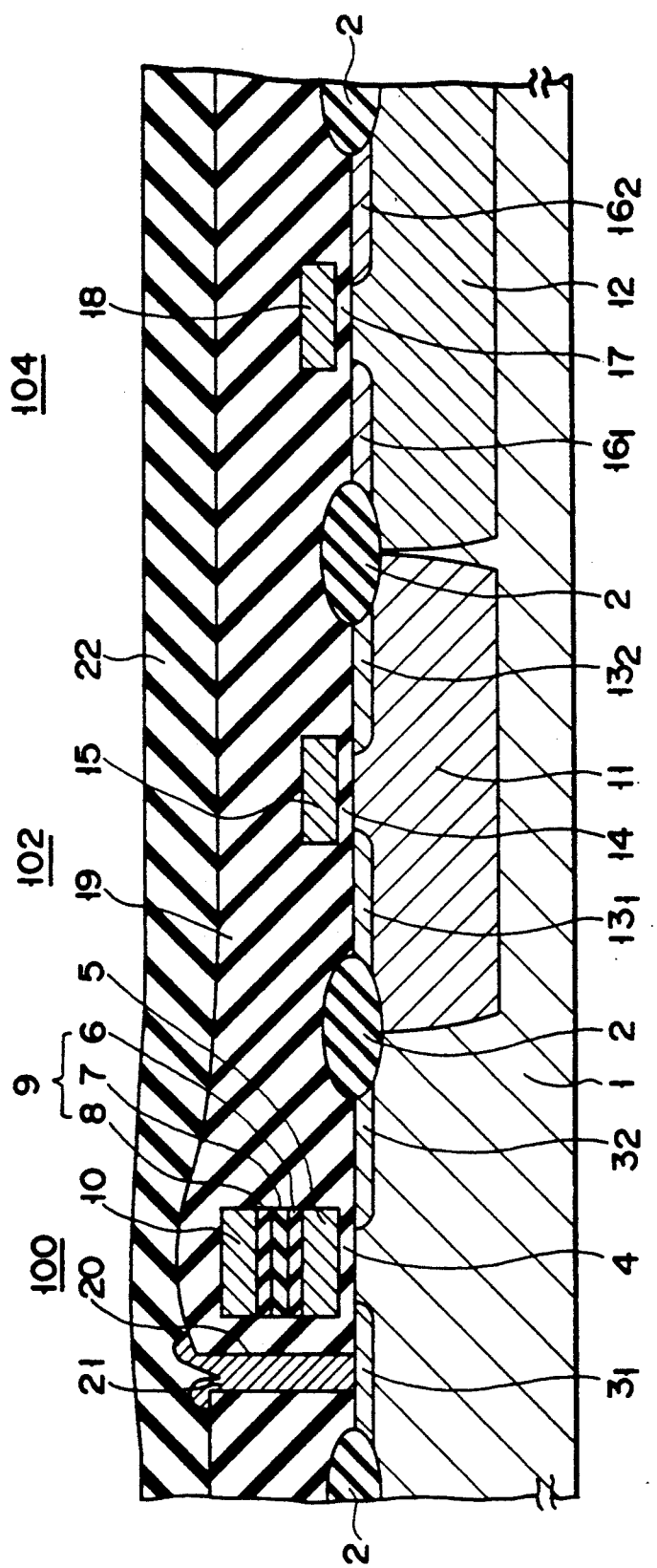
FIG. 1 is a sectional view of an EPROM according to one embodiment of the present invention.

FIG. 1 is a sectional view of an EPROM which is an example of the nonvolatile semiconductor memory device.

As is shown in FIG. 1, a field oxide film 2 used for element isolation is formed on the surface of a silicon substrate 1 of e g. a p-type. N-type source/drain regions $3_1$ and $3_2$ are formed in the surface region of the p-type silicon substrate 1. A first gate insulation film 4 is formed on the substrate portion located between the source/drain regions $3_1$ and $3_2$, and the gate insulation film 4 is overlaid with a floating gate 5. A second gate insulation film 9, which is e.g. a triple-layered structure made up of a nitride film 6, an oxide film 7 and a nitride film 8, is formed on the floating gate 5. A control gate 10 is formed on the second gate insulation film 9. By these structural elements, an n-channel EPROM memory cell 100 is obtained. The n-channel EPROM memory cell of this structure is generally referred to as a SAMOS (a stacked-gate avalanche-injection MOS).

A p-type well region 11 and an n-type well region 12 are formed in the surface region of the substrate 1. In the surface region of the p-type well region 11, n-type source/drain regions $13_1$ and $13_2$ are formed. A gate insulation film 14 is formed on that surface portion of the p-type well region 11 which is located between the n-type source/drain regions $13_1$ and $13_2$, and a gate 15 is formed on the gate insulation film 14. By these structural elements, an n-channel MOSFET 102 is constituted. In the surface region of the n-type well region 12, p-type source/drain regions $16_1$ and $16_2$ are formed. A gate insulation film 17 is formed on that surface portion of the p-type well region 11 which is located between the source/drain regions $16_1$ and $16_2$, and a gate 18 is formed on the gate insulation film 17. By these structural elements, a p-channel MOSFET 104 is constituted. The n-channel MOSFET 102 and the p-channel MOSFET 104 are used as elements of a decoder circuit or a logic circuit. The entire surface of the semiconductor device is covered with an interlayer insulation film 19, and a contact hole 20 leading to a predetermined point of the semiconductor device is formed in the interlayer insulation film 19. A wiring line 21, made of e.g. aluminum and connected to the predetermined point of the semiconductor device through the contact hole 20, is formed on the interlayer insulation film 19. A surface protection layer 22 is formed on the entire surface of the semiconductor device.

In the EPROM mentioned above, the memory cell 100 is formed on the p-type silicon substrate 1 in which impurities are distributed in a stable manner. Since an electric field is applied uniformly applied to the whole of the memory cell region, electrons can be implanted, with no deviation, into each of a large number of floating gates existing in the memory cell region. Accordingly, the memory cell 100 is very reliable in operation, particularly in data writing.

Moreover, the n-channel MOSFET 102 and the p-channel MOSFET 104 are provided for the p-type well region 11 and the n-type well region 12, respectively. In the case where the impurity concentration in the p-type well region 11 is made higher than that in the p-type substrate 1, latch-up is prevented from occurring even if the n-channel MOSFET 102 is miniaturized. Likewise, in the case where the impurity concentration in the n-type well region 12 is increased, latch-up is prevented from occurring even if the p-channel MOSFET 104 is miniaturized. More specifically, if the impurity concentrations in the p-type and n-type well regions 11 and 12 are increased, the base of a parasitic bipolar transistor which would form a parasitic thyristor will have an increased impurity concentration. Since, therefore, the parasitic bipolar transistor becomes hard to turn on, latch-up is reliably prevented from occurring.

As mentioned above, in the EPROM of the embodiment of the present invention, the n-channel EPROM memory cell 100 is provided for the p-type silicon substrate 1, while the n-channel MOSFET 102 is provided for the p-type well region 11 Since the n-channel EPROM memory cell 100 and the n-channel MOSFET 102 are therefore isolated from each other, the n-channel MOSFET 102 and the p-channel MOSFET 104 (which are used as a logic circuit, an EPROM's peripheral circuit [e.g., a decoder]) can be miniaturized, without adversely affecting the reliability of the EPROM memory cell 100 (for example, the reliability of data writing and the high breakdown voltage are not adversely affected). It should be also noted that the occurrence of latch-up is prevented even in the case where the n-channel and p-channel MOSFETs 102 and 104 are miniaturized.

A description will now be given as to how the EPROM of the above embodiment is manufactured, with reference to FIGS. 2A through 2J. These Figures are sectional views illustrating the EPROM in the order of manufacture. In the Figures, the same reference numerals as are used in FIG. 1 are used to indicate the same or corresponding structural elements shown in FIG. 1.

Figure 2A:
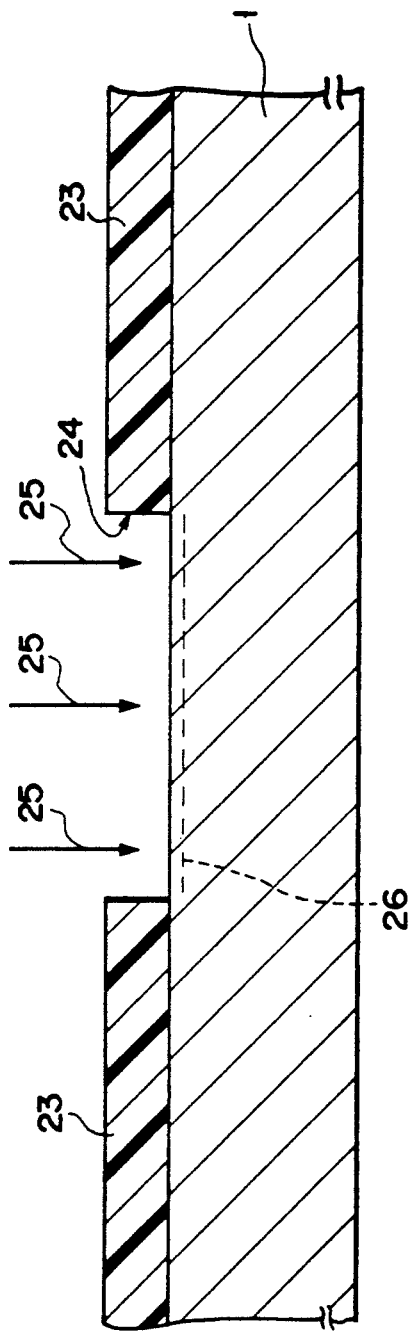

Referring first to FIG. 2A, a p-type silicon substrate 1 having an impurity concentration of $1 \times 10^{15}$ cm$^{31}$ $^3$ or so is prepared. An oxide film (not shown) is formed on surface of this substrate 1 by oxidation, and then photoresist 23 is coated on the entire surface of the resultant structure. A hole 24 is formed in the photoresist 23 by photographic etching such that the hole 24 corresponds to the pattern of a p-type well region to be formed later. Thereafter, p-type impurities, such as boron 25, are ion-implanted into the substrate 1 with a dose of $1 \times 10^{12}$ cm$^{-2}$ or so, using the photoresist 23 as a mask. In FIG. 2A, the region into which the boron 25 is ion-implanted is indicated by reference numeral 26.

Figure 2B:
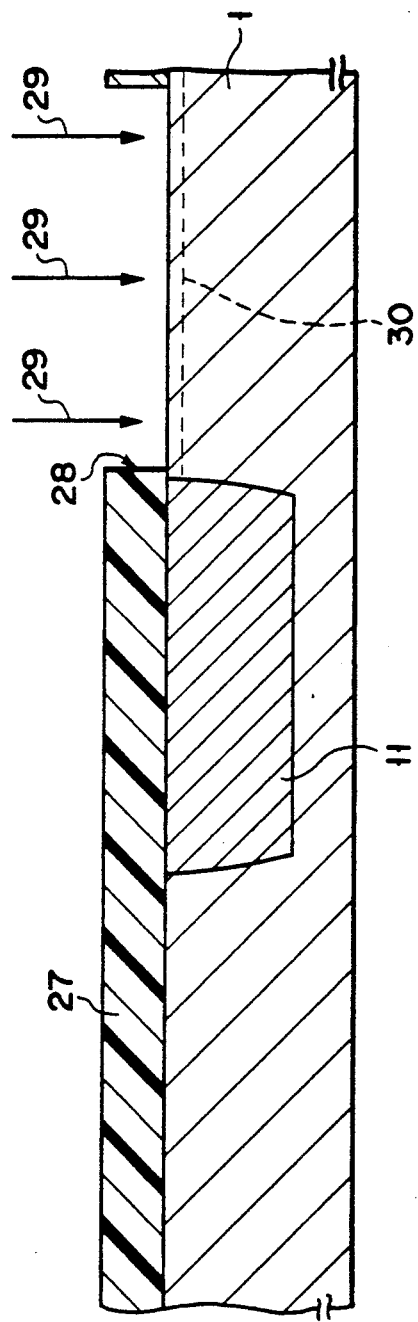

As is shown in FIG. 2B, the photoresist 23 is removed, and then the ion-implanted boron is thermally diffused by subjecting the semiconductor structure to heat treatment. By this heat treatment, a p-type well region 11 whose impurity concentration is $1 \times 10^{16}$ cm$^{-3}$ or so is formed in the substrate 1. Subsequently, photoresist 27 is coated on the entire surface of the resultant semiconductor structure. A hole 28 is formed in the photoresist 27 by photographic etching such that the hole 28 corresponds to the pattern of an n-type well region to be formed later. Thereafter, n-type impurities, such as phosphorus 29, are ion-implanted into the substrate 1 with a dose of $1 \times 10^{12}$ cm$^{-2}$ or so, using the photoresist 27 as a mask. In FIG. 2B, the region into which the arsenic 29 is ion-implanted is indicated by reference numeral 30.

Figure 2C:
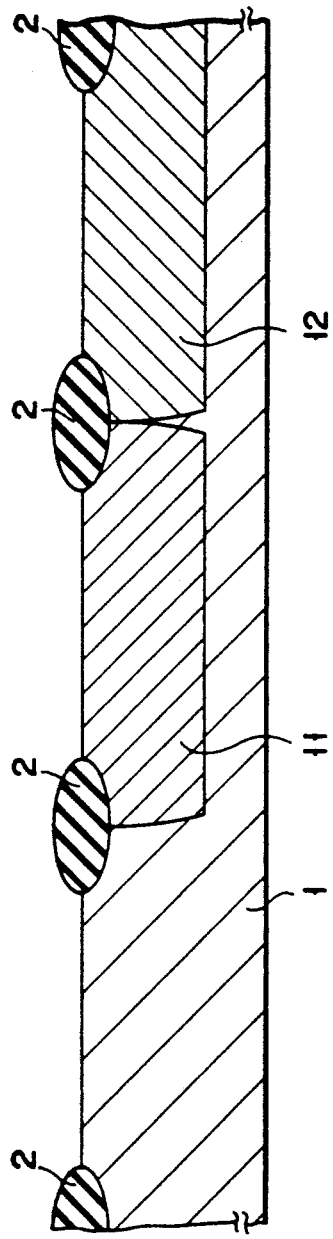

As is shown in FIG. 2C, the photoresist 27 is removed, and then the ion-implanted phosphorus is thermally diffused by subjecting the semiconductor structure to heat treatment. By this heat treatment, an n-type well region 12 whose impurity concentration is $1 \times 10^{16}$ cm$^{-3}$ or so is formed in the substrate 1. Next, a field oxide film 2 is formed by use of e.g. a LOCOS method, for the purpose of element isolation.

Incidentally, the ion implantation of the p-type impurities used for forming the p-type well region and the ion implantation of the n-type impurities used for forming the n-type well region need not be carried out in the above-mentioned order. That is, the ion implantation of the n-type impurities may be carried out first, being followed by the ion implantation of the p-type impurities.

After the p-type and n-type well regions are formed as above, impurities may be ion-implanted into the channel region of an EPROM memory cell transistor, so as to control the threshold value of this transistor.

Figure 2D:
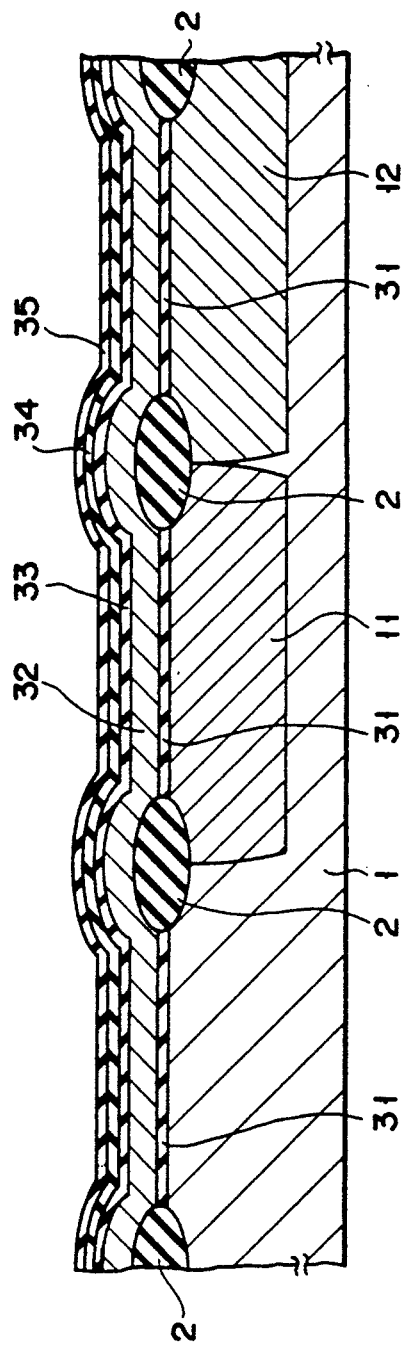

As is shown in FIG. 2D, a thermal oxide film 31 is formed on the exposed surface portions of the substrate by thermal oxidation. The thermal oxide film 31 is used as the first gate insulation film of the EPROM memory cell transistor. Next, a first polysilicon layer 32 is formed on the entire surface of the semiconductor structure. With respect to the first polysilicon layer 32, phosphorus diffusion is performed by use of POCl$_3$. By this phosphorus diffusion, the first polysilicon layer 32 is rendered conductive, i.e., the resistance thereof is reduced. After the phosphorus diffusion, a thermal oxide layer 33 is formed on the surface of the first polysilicon layer 32 by thermal oxidation, a nitride film 34 is formed on the entire surface of the semiconductor structure by CVD, and a thermal oxide film 35 is formed on the surface of the nitride film 34 by thermal oxidation.

Figure 2E:
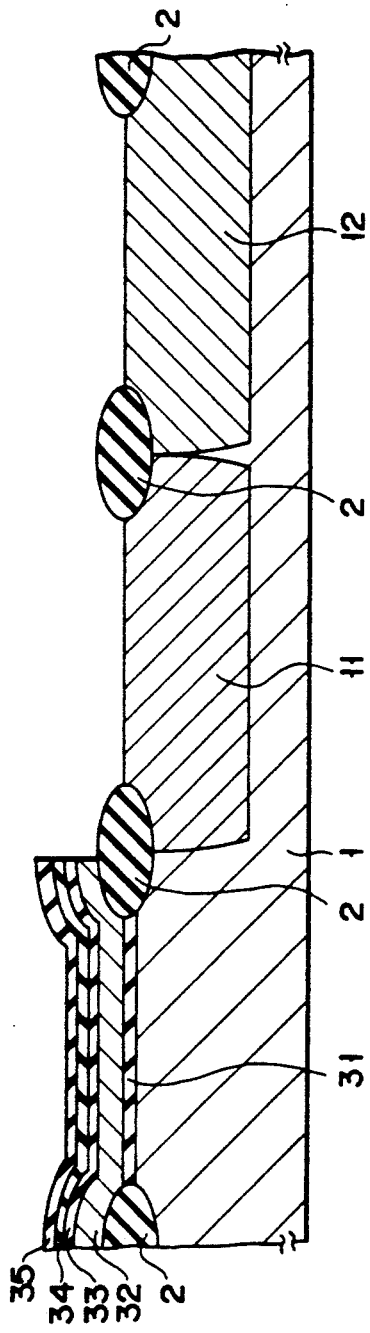

As is shown in FIG. 2E, the thermal oxide film 35, the nitride film 34, the thermal oxide film 33, the first polysilicon layer 32 and the thermal oxide film 31 are selectively removed by photographic etching, so as to expose that surface portion of the substrate 1 where the n-type well region 11 and the p-type well region 12 are formed.

During this etching step, a so-called "cell slit" (not shown) is formed in the EPROM memory cell region, such that the floating gate is divided into pieces for the respective EPROM memory cells.

After the etching step, impurities may be ion-implanted into the channel regions of the n-channel and p-channel MOSFETs, so as to control the threshold values of these transistors.

Figure 2F:
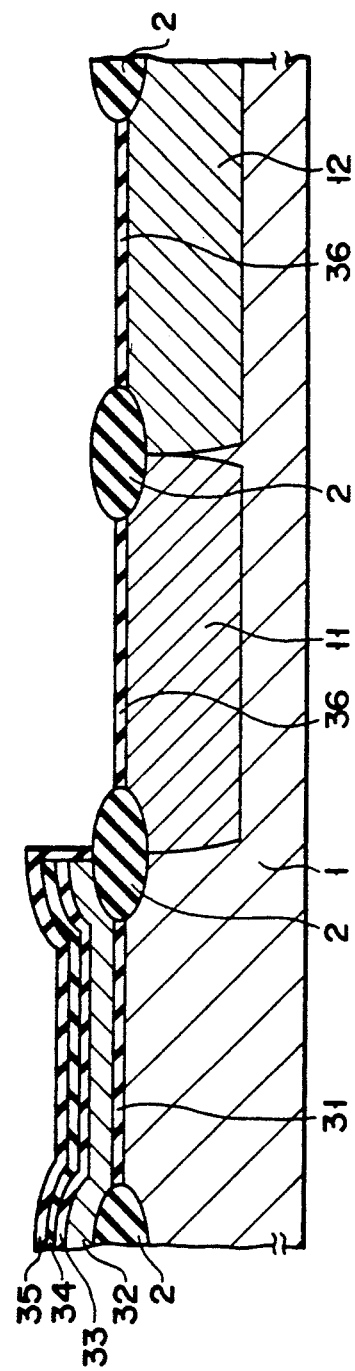

As is shown in FIG. 2F, a thermal oxide film 36 is formed, by thermal oxidation, on the exposed surface portions of the substrate and on the surface of the first polysilicon layer 32. This thermal oxide film 36 is used as a gate insulation film of the n-channel and p-channel MOSFETs.

As is shown in FIG. 2G, a second polysilicon layer 37 is formed o the entire surface of the semiconductor structure by CVD, for example. With respect to the second polysilicon layer 37, phosphorus diffusion is performed by use of POCl$_3$. By this phosphorus diffusion, the second polysilicon layer 37 is rendered conductive, i.e., the resistance thereof is reduced.

As is shown in FIG. 2H, the second polysilicon layer 37 is selectively removed by photographic etching, such that gates 15 and 18 of the n-channel and p-channel MOSFETs are formed. During this etching step, the EPROM memory cell region are kept covered with photoresist (not shown). Next, the second polysilicon layer 37, the thermal oxide film 35, the nitride film 34, the thermal oxide film 33 and the first polysilicon layer 32 are selectively removed by photographic etching, such that a control gate 10, a second gate insulation film 9 and a floating gate 5 are formed for the EPROM memory cell. During this etching step, the regions of the n-channel and p-channel MOSFETs are kept covered with photoresist (not shown). Thereafter, photoresist 38 is coated on the entire surface of the semiconductor structure. A hole 39 is formed in the photoresist 38 by photographic etching such that the hole 39 corresponds to the region where both the EPROM memory cell and the n-channel MOSFET are formed. Thereafter, n-type impurities, such as arsenic or phosphorus 40, are ion-implanted into the substrate 1 and p-type well region 11, using the photoresist 38, the control gate 10, the gate 15, etc. as a mask. In FIG. 2H, the region into which the arsenic or phosphorus 40 is ion-implanted is indicated by reference numeral 41.

Figure 2I:
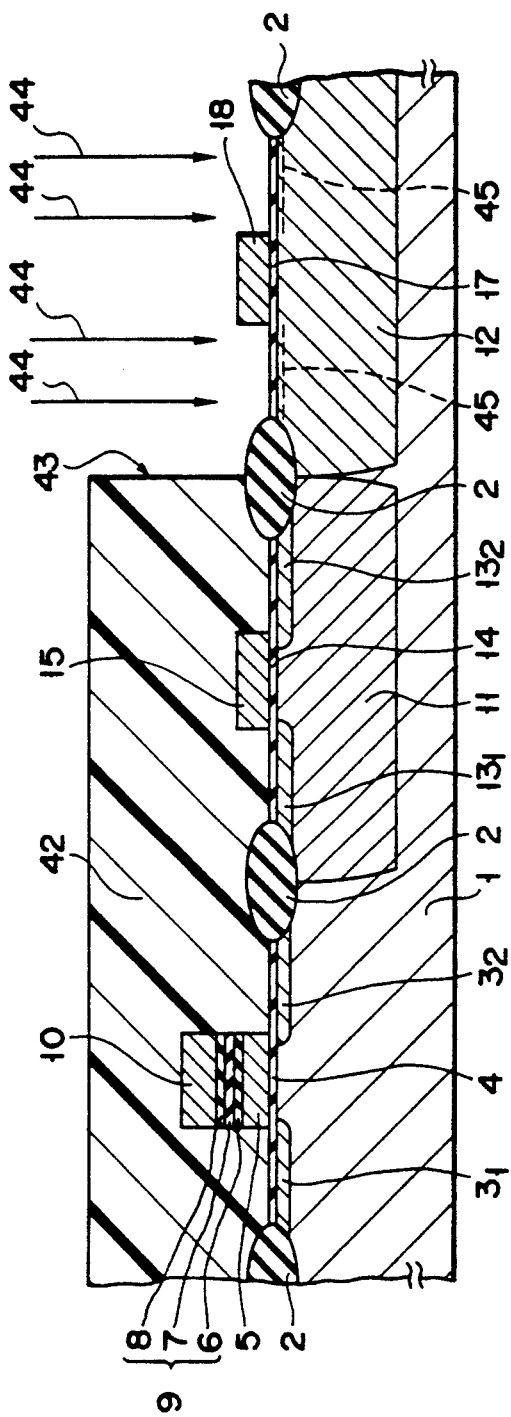

As is shown in FIG. 2I, photoresist 42 is formed on the entire surface of the semiconductor structure. A hole 43 is formed in the photoresist 42 by photographic etching such that the hole 43 corresponds to the region where the p-channel MOSFET is formed. Thereafter, p-type impurities, such as boron 44, are ion-implanted into the n-type well region 12, using the photoresist 42, the gate 18, etc. as a mask. In FIG. 2I, the region into which the boron is ion-implanted is indicated by reference numeral 45.

Figure 2J:
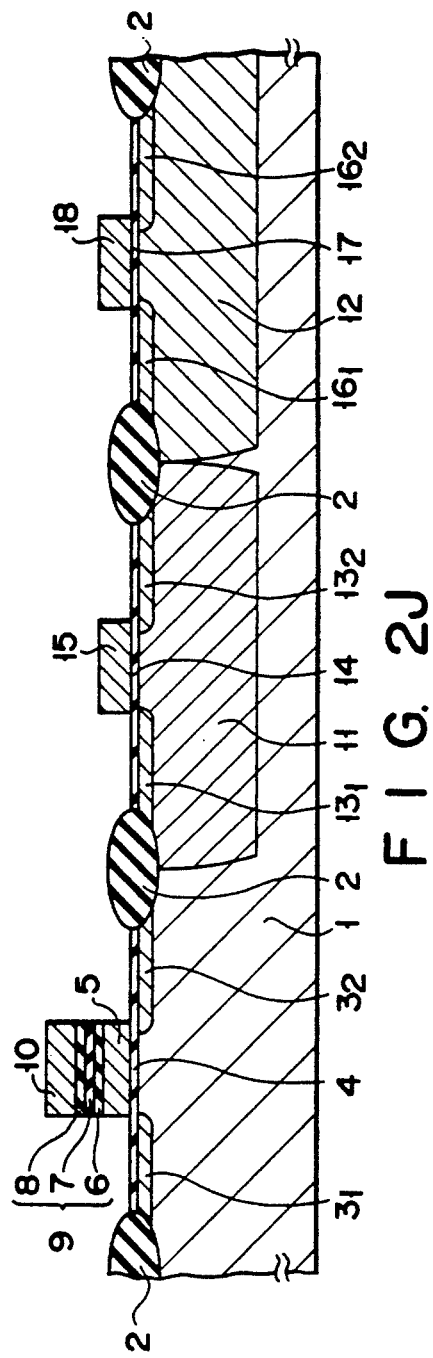

As is shown in FIG. 2J, the photoresist 42 is removed from the semiconductor structure. Subsequently, the semiconductor structure is subject to heat treatment, so as to thermally diffuse the ion-implanted impurities, namely, the arsenic (or phosphorus) and boron. As a result of this heat treatment, n-type source/drain regions $3_1$, $3_2$, $13_1$ and $13_2$ and p-type source/drain regions $16_1$ and $16_2$ are formed.

As is shown in FIG. 1, an interlayer insulation film 19 is formed on the entire surface of the semiconductor structure by CVD. A contact hole 20, which leads to a predetermined point of the semiconductor structure, is selectively formed in the interlayer insulation film 19 by photographic etching. Subsequently, an aluminum film is formed on the entire surface of the semiconductor structure by sputtering. Finally, the aluminum film is selectively removed by photographic etching, such that a wiring line 21 having a predetermined pattern is left on the interlayer insulation film 19.

In the method mentioned above, the EPROM of the embodiment of the present invention is manufactured.

By use of the manufacturing method mentioned above, an EPROM 100 which ensures reliable data writing and has a high breakdown voltage, and n-channel and p-channel MOSFETs 102 and 104 which are miniaturized but hardly undergo latch-up, can be provided for the same substrate.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
    a semiconductor substrate of a first conductivity type having a major surface region, said substrate having an impurity concentration of $p_1$;
    a first well region of the first conductivity type in the major surface region of said substrate, said first well region having an impurity concentration of $p_2$, said impurity concentrations $p_1$ and $p_2$ having a relationship expressed by $p_1 < p_2$;
    a second well region of a second conductivity type in the major region of said substrate;
    an isolation region in the major surface region of said substrate, the isolation region having first, second and third element regions in said substrate, said first well region, said second well region, and said first element region comprising a memory cell region, and said second and third element regions comprising a peripheral circuit region;
    a first insulating layer on said first element region;
    a floating gate electrode on said first insulating layer;
    a second insulating layer on said floating gate electrode;
    third and fourth insulating layers on said second and third element regions, respectively, said third and fourth insulating layer being portions of a common layer;
    a control gate electrode on said second insulating layer;
    first and second gate electrodes on said third and fourth insulating layers, respectively, said first gate electrode and said second gate electrode being of material like that of said control gate electrode;
    first and second active regions of a memory cell transistor of the second conductivity type in said first element region, said first and second active regions containing a first impurity of the second conductivity type;
    third and fourth active regions of an insulated gate FET of the second conductivity type provided in said second element region, said third and fourth active regions containing said first impurity of the second conductivity type;
    fifth and sixth active regions of an insulated gate FET of the first conductivity type provided in said third element region, said fifth and sixth active regions containing a second impurity of the first conductivity type;
    a fifth insulating layer provided over the major surface of said semiconductor substrate; and
    a wiring provided on said fifth insulating layer so as to be electrically connected to at least one of said first to sixth active regions.

2. The semiconductor device according to claim 1, wherein said first conductivity type is p-type, and said second conductivity type is n-type.

3. The semiconductor device according to claim 1, wherein said first active region forms a source region of said memory cell transistor, said second active region forms a drain region of said memory cell transistor, said third active region forms a source region of said insulated gate FET of the second conductivity type, said fourth active region forms a drain region of said insulated gate FET of the second conductivity type, said fifth active region forms a source region of said insulated gate FET of the first conductivity type, and said sixth active region forms a drain region of said insulated gate FET of the first conductivity type.

4. The semiconductor device according to claim 1, wherein said first and second active regions have an impurity concentration of $p_3$, and said third and fourth active regions have an impurity concentration of $p_4$, said impurity concentrations $p_3$ and $p_4$ having a relationship expressed by $p_3 < p_4$.

5. The semiconductor device according to claim 1, wherein said second insulating film comprises a laminated film of a thermal oxide layer and a nitride layer.

* * * * *